United States Patent
Kuo et al.

(10) Patent No.: US 11,302,806 B1
(45) Date of Patent: Apr. 12, 2022

(54) DOUBLE-GATE TRENCH-TYPE INSULATED-GATE BIPOLAR TRANSISTOR DEVICE

(71) Applicant: Huge Power Limited Taiwan Branch (B.V.I.), Hsinchu County (TW)

(72) Inventors: Jia-Ming Kuo, Taoyuan (TW); Chung-Wei Yu, Hsinchu (TW); Kuo-Lun Huang, Hsinchu (TW); Chao-Tsung Chang, Taichung (TW)

(73) Assignee: HUGE POWER LIMITED TAIWAN BRANCH (B.V.I.), Hsinchu County (TW)

( * ) Notice: Subject to any disclaimer, the term of this patent is extended or adjusted under 35 U.S.C. 154(b) by 0 days.

(21) Appl. No.: 17/102,488

(22) Filed: Nov. 24, 2020

(51) Int. Cl.
*H01L 29/739* (2006.01)
*H01L 29/423* (2006.01)
*H01L 29/08* (2006.01)
*H01L 29/10* (2006.01)
*H01L 29/49* (2006.01)

(52) U.S. Cl.
CPC ...... *H01L 29/7397* (2013.01); *H01L 29/0804* (2013.01); *H01L 29/0847* (2013.01); *H01L 29/1095* (2013.01); *H01L 29/4236* (2013.01); *H01L 29/4916* (2013.01)

(58) Field of Classification Search
None
See application file for complete search history.

(56) References Cited

U.S. PATENT DOCUMENTS

| | | | |
|---|---|---|---|
| 10,923,583 B2* | 2/2021 | Li | H01L 29/083 |
| 2012/0025874 A1* | 2/2012 | Saikaku | H01L 29/7397 |
| | | | 327/109 |
| 2012/0313139 A1* | 12/2012 | Matsuura | H01L 29/1095 |
| | | | 257/139 |
| 2016/0300938 A1* | 10/2016 | Tonari | H01L 29/7397 |
| 2018/0261666 A1* | 9/2018 | Zeng | H01L 29/7802 |
| 2019/0051739 A1* | 2/2019 | Naito | H01L 29/1095 |

* cited by examiner

*Primary Examiner* — Ali Naraghi
(74) *Attorney, Agent, or Firm* — WPAT, PC

(57) ABSTRACT

The present invention discloses a double-gate trench-type insulated-gate bipolar transistor device. A first trench and a second trench, which are located in a P-type doped well layer, and separate from each other, are extended into a lightly-doped N-type drift layer. A heavily-doped P-type source region and a heavily-doped N-type source region, which are sequentially connected, are located between the first trench and the second trench, and are arranged at an upper part of the P-type doped well layer in a horizontal direction. The heavily-doped P-type source region is located at a periphery of the second trench, a middle part and the upper part of the P-type doped well layer are provided with an N-type doped well layer and a P-type doped base region layer, respectively. The heavily-doped P-type source region and the heavily-doped N-type source region are both located at an upper part of the P-type doped base region layer.

16 Claims, 5 Drawing Sheets

DOUBLE-GATE TRENCH-TYPE INSULATED-GATE BIPOLAR TRANSISTOR DEVICE

BACKGROUND OF THE INVENTION

1. Field of the Invention

The present invention generally relates to a semiconductor device and, more particularly, to a double-gate trench-type insulated-gate bipolar transistor device.

2. Description of the Related Art

An insulated-gate bipolar transistor is a compound fully-controlled type voltage-driven power semiconductor device composed of a bipolar junction transistor and an insulated-gate field-effect transistor, thereby having both the advantages of high input impedance of a metal oxide semiconductor field-effect transistor (MOSFET) and low on-state voltage drop of a giant transistor (GTR). The GTR has a low saturation voltage drop, a large carrier destiny, but a relatively large drive current; while the MOSFET has a very small drive power, fast on-off speeds, but a large on-state voltage drop and a small carrier density. The IGBT integrates the advantages of the two devices above, and has a small drive power and a low saturation voltage drop. It is therefore suitable for a direct current converter system of 600V or higher, such as the field of an alternating current electric motor, a frequency converter, a switch power supply, a lighting circuit and a traction drive.

A conventional IGBT still has a relatively large power loss, which makes lowering of the power loss of the IGBT being one of research focuses.

SUMMARY OF THE INVENTION

The present invention aims at providing a double-gate trench-type insulated-gate bipolar transistor device. The double-gate trench-type insulated-gate bipolar transistor device has a very-low $V_{CE}$(sat) saturation voltage, lowers a power efficiency loss, achieves, under an on-state of the device, a very low on-state voltage and quicker start, enables the device to be turned off more quickly under an off-state of the device, and may reduce occurrence of a dynamic latch-up effect.

To achieve the above purpose, the present invention adopts a technical solution as follows: a double-gate trench-type insulated-gate bipolar transistor device includes a P-type doped well layer located at an upper part of a lightly-doped N-type silicon substrate, a lightly-doped N-type drift layer located at a middle part of the lightly-doped N-type silicon substrate, a lightly-doped N-type buffer layer located at a lower middle part of the lightly-doped N-type silicon substrate and a heavily-doped P-type collector region layer located at a lower part of the lightly-doped N-type silicon substrate.

A first trench and a second trench, which are located in the P-type doped well layer and separate from each other, are extended into the lightly-doped N-type drift layer, the first trench and the second trench are internally provided with a first gate portion and a second gate portion, respectively, with the first gate portion being isolated from the first trench through a first gate silicon dioxide layer, and the second gate portion being isolated from the second trench through a second gate silicon dioxide layer.

A heavily-doped P-type source region and a heavily-doped N-type source region, which are sequentially connected, are located between the first trench and the second trench, and are arranged at an upper part of the P-type doped well layer in a horizontal direction, with the heavily-doped P-type source region being located at a periphery of the second trench, and the heavily-doped N-type source region being located at a periphery of the first trench.

A middle part and the upper part of the P-type doped well layer are provided with an N-type doped well layer and a P-type doped base region layer, respectively, and the heavily-doped P-type source region and the heavily-doped N-type source region are both located at an upper part of the P-type doped base region layer.

A surface, distant from the lightly-doped N-type buffer layer, of the heavily-doped P-type collector region layer is covered with a collector layer. An upper surface of the heavily-doped P-type source region and an upper surface of the heavily-doped N-type source region each are covered with an emitter layer. A first gate layer and a second gate layer are located on an upper surface of the first gate portion and an upper surface of the second gate portion, respectively.

The technical solution above includes the further-improved solutions listed below.

1. In the solution above, the first trench and the second trench are extended to an upper part of the lightly-doped N-type drift layer.

2. In the solution above, the first gate portion and the second gate portion are both polycrystalline silicon gate portions.

3. In the solution above, the first gate silicon dioxide layer and the second gate silicon dioxide layer are both silicon dioxide layers.

4. In the solution above, a width of the heavily-doped P-type source region is greater than a width of the heavily-doped N-type source region.

5. In the solution above, a width ratio of the heavily-doped N-type source region to the heavily-doped P-type source region is 1:1.5 to 1:3.

6. In the solution above, a depth, in the P-type doped base region layer, of the heavily-doped P-type source region is the same as that of the heavily-doped N-type source region.

7. In the solution above, a depth ratio of the P-type doped base region layer to the heavily-doped P-type source region and a depth ratio of the P-type doped base region layer to the heavily-doped N-type source region are 10:4 to 10:6.

8. In the solution above, an area of a part of the emitter layer covering the heavily-doped P-type source region is greater than an area of a part of the emitter layer covering the heavily-doped N-type source region.

By adopting the above technical solutions, compared with the prior art, the present invention has the advantages as described below.

According to the double-gate trench-type insulated-gate bipolar transistor device, the heavily-doped P-type source region and the heavily-doped N-type source region, which are sequentially connected, are located between the first trench and the second trench, and are arranged at the upper part of the P-type doped well layer in a horizontal direction, the heavily-doped P-type source region is located at the periphery of the second trench, the heavily-doped N-type source region is located at the periphery of the first trench, the middle part and the upper part of the P-type doped well layer are provided with the N-type doped well layer and the P-type doped base region layer respectively, and the heavily-doped P-type source region and the heavily-doped N-type source region are both located at the upper part of the P-type doped base region layer. The transistor device has a very-low $V_{CE}$(sat) saturation voltage, lowers a power efficiency loss, achieves, under an on-state of the device, a very low on-state voltage and quicker start, and enables the device to be turned off more quickly under an off-state of the device. Further, the width of the heavily-doped P-type source region is greater than the width of the heavily-doped N-type source region, thereby reducing occurrence of a dynamic latch-up effect.

Figure 1:
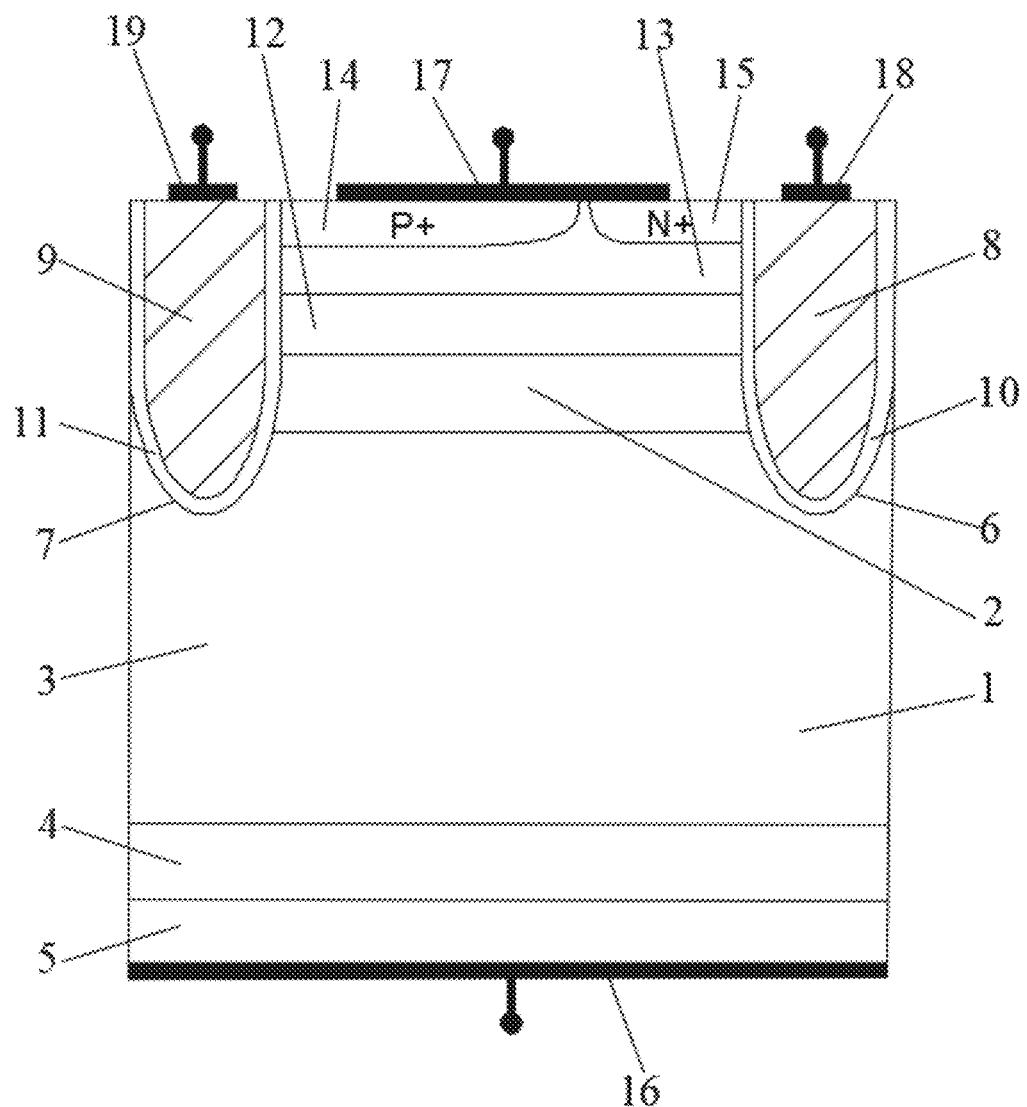
FIG. 1 is schematic structural diagram of a double-gate trench-type insulated-gate bipolar transistor device of the present invention.
Figure 2:
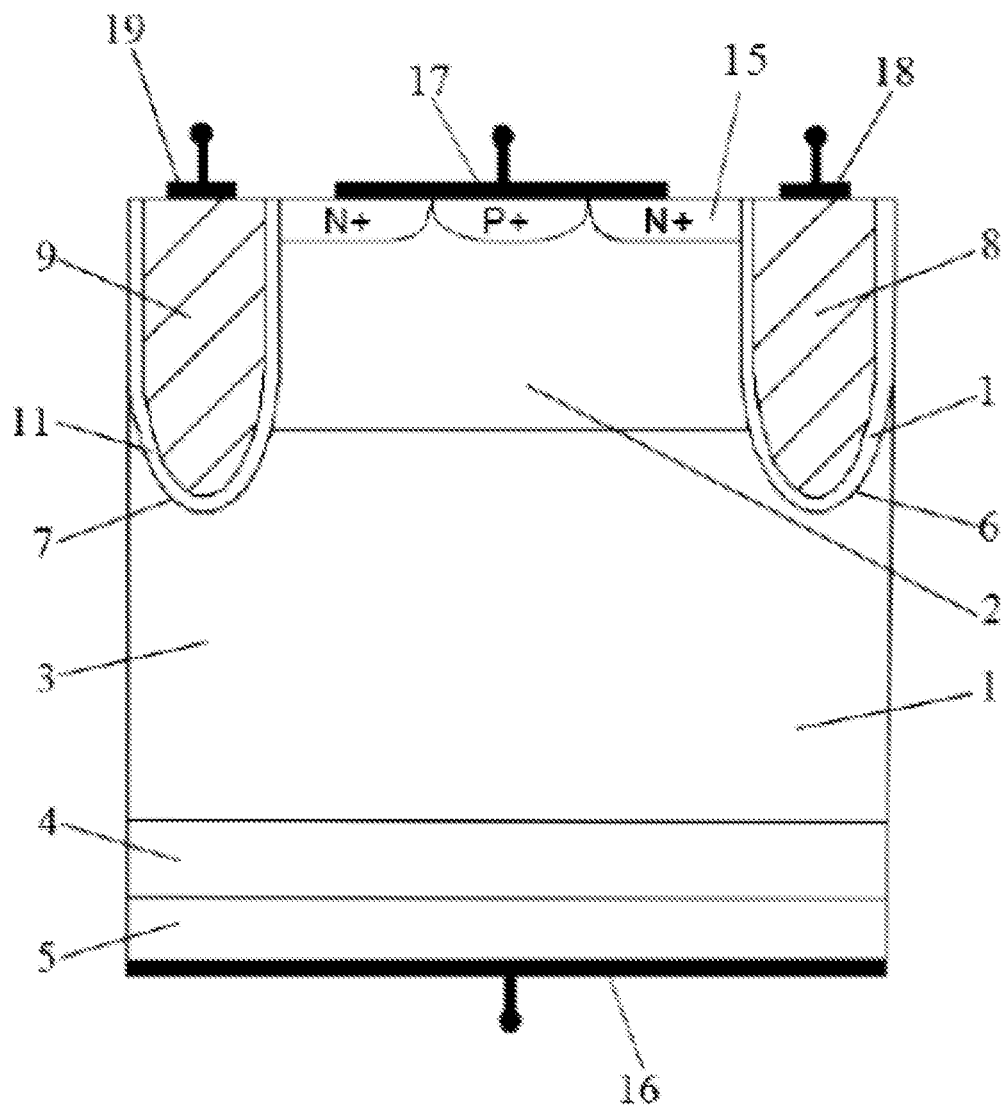
FIG. 2 is a schematic structural diagram of a double-gate trench-type insulated-gate bipolar transistor device of a comparative example.
Figure 3:
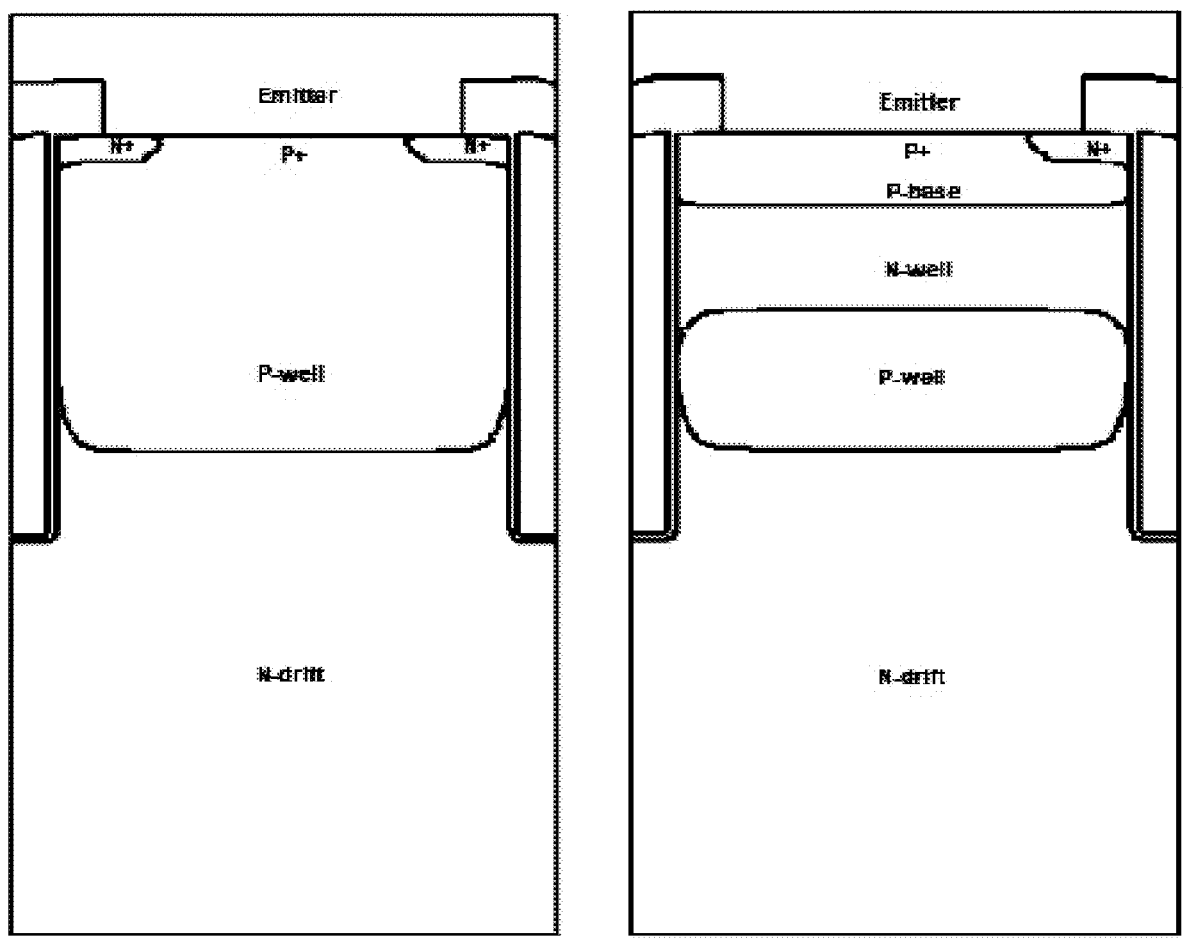
FIG. 3 shows simulated structure diagrams of a device of a comparative example and the device of the present invention.
Figure 4:
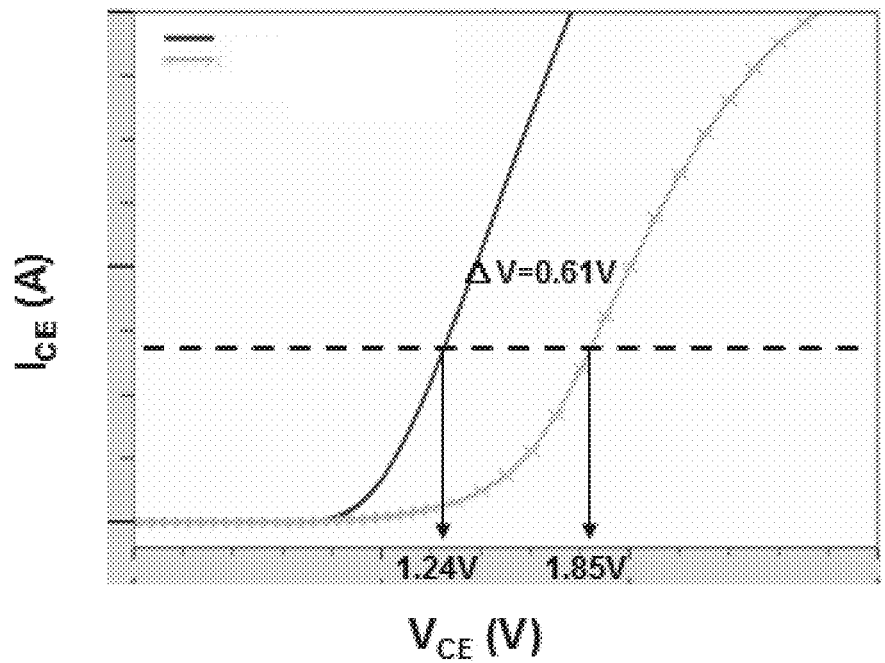
FIG. 4 is a $V_{CE}$ test chart of the device of the present invention and the device of the comparative example.
Figure 5:
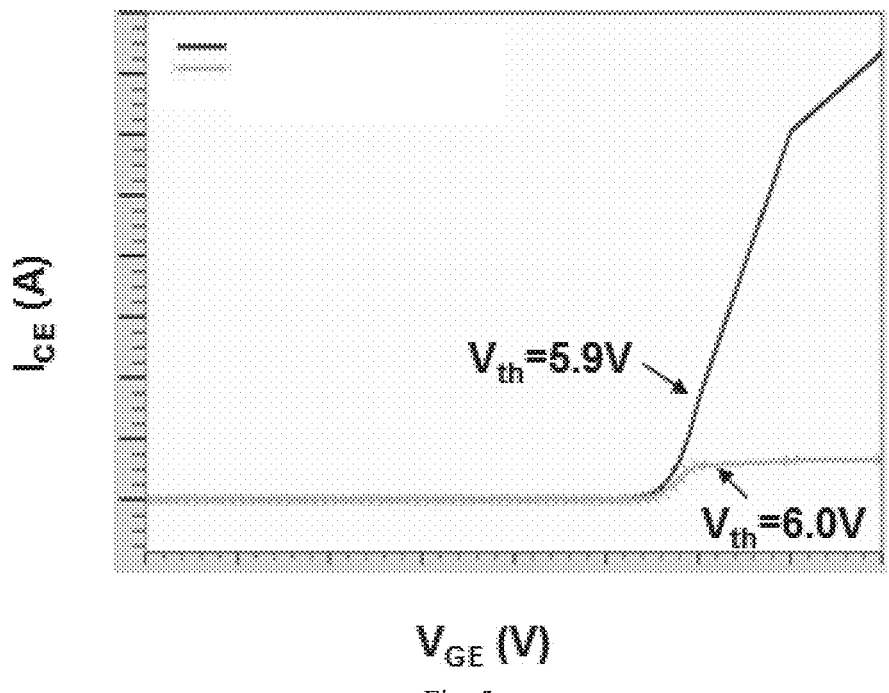
FIG. 5 is a $V_{GE}$ test chart of the device of the present invention and the device of the comparative example.

In the figures above, reference numbers stand for the following: 1. lightly-doped N-type silicon substrate; 2. P-type doped well layer; 3. lightly-doped N-type drift layer; 4. lightly-doped N-type buffer layer; 5. heavily-doped P-type collector region layer; 6. first trench; 7. second trench; 8. first gate portion; 9. second gate portion; 10. first gate silicon dioxide layer; 11. second gate silicon dioxide layer; 12. N-type doped well layer; 13. P-type doped base region layer; 14. heavily-doped P-type source region; 15. heavily-doped N-type source region; 16. collector layer; 17. emitter layer; 18. first gate layer; and 19. second gate layer.

DETAILED DESCRIPTION OF THE INVENTION

In the description of the present invention, it should be noted that the orientation or positional relationships indicated by the terms "center", "up", "down", "left", "right", "vertical", "horizontal" "inside", "outside", etc. are based on the orientation or positional relationship shown in the accompanying drawings, are merely for facilitating the description of the present invention and simplifying the description, rather than indicating or implying that an apparatus or module referred to must have a particular orientation or be constructed and operated in a particular orientation, and therefore cannot be interpreted as limiting the present invention. The terms "first", "second" and "third" are merely used for describing purposes and cannot be interpreted as indicating or implying relative importance. In addition, unless otherwise explicitly specified and defined, the terms "mounting", "connecting", and "connection" should be understood in a broad sense. For example, it may be a fixed connection, a detachable connection, or an integrated connection, may be a mechanical connection, or an electric connection, and may be a direct connection, an indirect connection via an intermediate medium, or a communication between the interiors of two modules. For those of ordinary skill in the art, the specific meanings of the above terms in the present invention could be understood according to specific circumstances.

1st embodiment: a double-gate trench-type insulated-gate bipolar transistor device includes a P-type doped well layer 2 located at an upper part of a lightly-doped N-type silicon substrate 1, a lightly-doped N-type drift layer 3 located at a middle part of the lightly-doped N-type silicon substrate 1, a lightly-doped N-type buffer layer 4 located at a lower middle part of the lightly-doped N-type silicon substrate 1 and a heavily-doped P-type collector region layer 5 located at a lower part of the lightly-doped N-type silicon substrate 1.

A first trench 6 and a second trench 7, which are located in the P-type doped well layer 2 and separate from each other, are extended into the lightly-doped N-type drift layer 3. The first trench 6 and the second trench 7 are internally provided with a first gate portion 8 and a second gate portion 9, respectively. The first gate portion 8 is isolated from the first trench 6 through a first gate silicon dioxide layer 10, and the second gate portion 9 is isolated from the second trench 7 through a second gate silicon dioxide layer 11.

A heavily-doped P-type source region 14 and a heavily-doped N-type source region 15, which are sequentially connected, are located between the first trench 6 and the second trench 7, and are arranged at an upper part of the P-type doped well layer 2 in a horizontal direction. The heavily-doped P-type source region 14 is located at a periphery of the second trench 7, and the heavily-doped N-type source region 15 is located at a periphery of the first trench 6.

A middle part and the upper part of the P-type doped well layer 2 are provided with an N-type doped well layer 12 and a P-type doped base region layer 13, respectively, and the heavily-doped P-type source region 14 and the heavily-doped N-type source region 15 are both located at an upper part of the P-type doped base region layer 13.

A surface distant from the lightly-doped N-type buffer layer 4, of the heavily-doped P-type collector region layer 5 is covered with a collector layer 16. Each of an upper surface of the heavily-doped P-type source region 14 and an upper surface of the heavily-doped N-type source region 15 is covered with an emitter layer 17. A first gate layer 18 and a second gate layer 19 are located on an upper surface of the first gate portion 8 and an upper surface of the second gate portion 9, respectively.

The first gate portion 8 and the second gate portion 9 are both polycrystalline silicon gate portions.

A width of the heavily-doped P-type source region 14 is greater than a width of the heavily-doped N-type source region 15.

A width ratio of the heavily-doped N-type source region 15 to the heavily-doped P-type source region 14 is 1:2.5.

A depth ratio of the P-type doped base region layer 13 to the heavily-doped P-type source region 14 and a depth ratio of the P-type doped base region layer to the heavily-doped N-type source region 15 are 10:5.

An area of a part of the emitter layer 17 covering the heavily-doped P-type source region 14 is greater than an area of a part of the emitter layer 17 covering the heavily-doped N-type source region 15.

2nd embodiment: a double-gate trench-type insulated-gate bipolar transistor device includes a P-type doped well layer 2 located at an upper part of a lightly-doped N-type silicon substrate 1, a lightly-doped N-type drift layer 3 located at a middle part of the lightly-doped N-type silicon substrate 1, a lightly-doped N-type buffer layer 4 located at a lower middle part of the lightly-doped N-type silicon substrate 1 and a heavily-doped P-type collector region layer 5 located at a lower part of the lightly-doped N-type silicon substrate 1.

A first trench 6 and a second trench 7, which are located in the P-type doped well layer 2 and separate from each other, are extended into the lightly-doped N-type drift layer 3. The first trench 6 and the second trench 7 are internally provided with a first gate portion 8 and a second gate portion 9, respectively. The first gate portion 8 is isolated from the first trench 6 through a first gate silicon dioxide layer 10, and the second gate portion 9 is isolated from the second trench 7 through a second gate silicon dioxide layer 11.

A heavily-doped P-type source region 14 and a heavily-doped N-type source region 15, which are sequentially connected, are located between the first trench 6 and the second trench 7, and are arranged at an upper part of the P-type doped well layer 2 in a horizontal direction. The heavily-doped P-type source region 14 is located at a periphery of the second trench 7, and the heavily-doped N-type source region 15 is located at a periphery of the first trench 6.

A middle part and the upper part of the P-type doped well layer 2 are provided with an N-type doped well layer 12 and a P-type doped base region layer 13, respectively, and the heavily-doped P-type source region 14 and the heavily-doped N-type source region 15 are both located at an upper part of the P-type doped base region layer 13.

A surface, distant from the lightly-doped N-type buffer layer 4, of the heavily-doped P-type collector region layer 5 is covered with a collector layer 16. Each of an upper surface of the heavily-doped P-type source region 14 and an upper surface of the heavily-doped N-type source region 15 is covered with an emitter layer 17. A first gate layer 18 and a second gate layer 19 are located on an upper surface of the first gate portion 8 and an upper surface of the second gate portion 9, respectively.

The first trench 6 and the second trench 7 are extended to an upper part of the lightly-doped N-type drift layer 3.

The first gate silicon dioxide layer 10 and the second gate silicon dioxide layer 11 are both silicon dioxide layers.

A width ratio of the heavily-doped N-type source region 15 to the heavily-doped P-type source region 14 is 1:1.8.

A depth, in the P-type doped base region layer 13, of the heavily-doped P-type source region 14 is the same as that of the heavily-doped N-type source region 15.

A depth ratio of the P-type doped base region layer 13 to the heavily-doped P-type source region 14 and a depth ratio of the P-type doped base region layer to the heavily-doped N-type source region 15 are 10:5.5.

Figure 6:
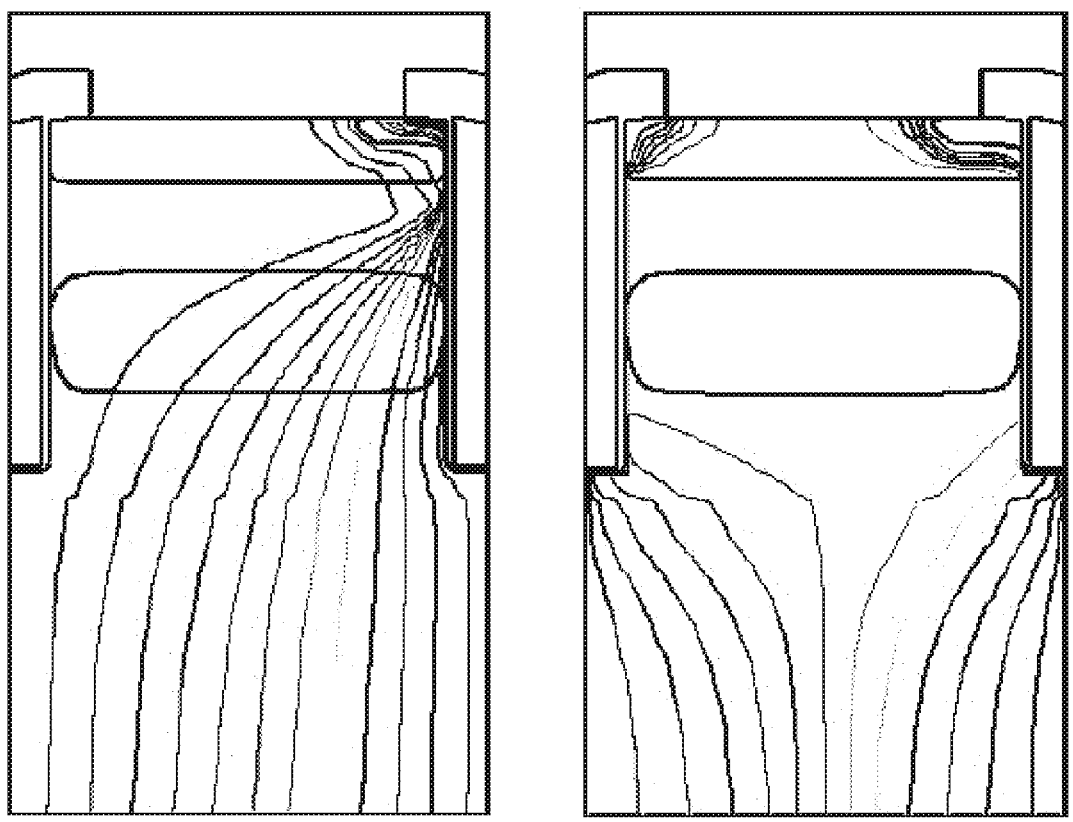
FIG. 6 is a schematic diagram of current lines of an apparatus for turning on and turning off an insulated-gate bipolar transistor of the present invention.

In FIG. 6, distribution of current lines of the device of the present invention is clearly shown. Under an on-state of the device, Gate 1 controls an N channel of a single side, only through which a current flows. In contrast, no N channel is formed for Gate 2. As shown on the left of FIG. 6, in a simulated on-state, the current lines are mostly distributed in the whole device, then flows through an inversion channel of the P-type doped base region layer 13, and an ultra-low on-state voltage is resulted from conductivity modulation and a low-gain PNP-type BJT. On the right of FIG. 6, simulated off leak current lines are shown. Under the conditions of $V_{GE}=-5V$ and $V_{CE}=600V$, it is clearly indicated that a leak current of a side wall of Gate 2 is about half that of a transistor, and the other half of the leak current flows through a side wall of Gate 1, which may help in electron hole extraction at a contact position of an emitter. Otherwise, a speed of the device may be decreased or dynamic latch-up may be caused, and therefore no current flows therethrough. In an off-state of the device, a leak current flows in a dispersed manner, and flows through Gate 1 and Gate 2 separately.

An operation mechanism of the present invention is as follows: in the on-state of the device, the heavily-doped P-type source region and the heavily-doped N-type source region may collect a large quantity of electron holes, "barriers" generated by a low-gain PNP-type BJT formed by the P-type doped base region layer, the N-type doped well layer and the P-type doped well layer are inhibited, which further results in electron injection adding, and makes conductivity of the lightly-doped N-type drift layer be adjusted more notably. Meanwhile, in an on-state, part of an electron current may flow through a side wall of the first trench of Gate 1. Further, part of the electron current may initially flow through a channel formed in the P-type doped base region layer, and then, through electron injection, into a PNP-type BJT formed by the N-type doped well layer and the P-type doped well layer. A thyristor formed by the PNP-type BJT further reinforces plasma injection. Thus, a very low on-state voltage is achieved. In an off-state of the device, the periphery of the second trench may provide a large quantity of electron hole removing routes. The width of the heavily-doped P-type source region is greater than that of the heavily-doped N-type source region, and occurrence of a dynamic latch-up effect may be reduced when the device is turned off more quickly.

When the double-gate trench-type insulated-gate bipolar transistor device is used, the heavily-doped P-type source region and the heavily-doped N-type source region, which are sequentially connected, are located between the first trench and the second trench, and are arranged at the upper part of the P-type doped well layer in a horizontal direction. The heavily-doped P-type source region is located at the periphery of the second trench, and the heavily-doped N-type source region is located at the periphery of the first trench. The middle part and the upper part of the P-type doped well layer are provided with the N-type doped well layer and the P-type doped base region layer, respectively. The heavily-doped P-type source region and the heavily-doped N-type source region are both located at the upper part of the P-type doped base region layer. The transistor device has a very low $V_{CE}(sat)$ saturation voltage, lowers a power efficiency loss, achieves, under an on-state of the device, a very low on-state voltage and quicker start, and enables the device to be turned off more quickly under an off-state of the device. Further, the width of the heavily-doped P-type source region is greater than the width of the heavily-doped N-type source region, thereby reducing occurrence of a dynamic latch-up effect.

The embodiments above are only used for describing the technical conception and characteristics of the present invention, such that a person who is familiar with such technology can understand the contents of the present invention and implement the same, but the contents cannot be used for limiting the scope of protection of the present invention. Any equivalent change or modification made according to the spirit essence of the present invention shall fall within the scope of protection of the present invention.

What is claimed is:

1. A double-gate trench-type insulated-gate bipolar transistor device, comprising a P-type doped well layer located at an upper part of a lightly-doped N-type silicon substrate, a lightly-doped N-type drift layer located at a middle part of the lightly-doped N-type silicon substrate, a lightly-doped N-type buffer layer located at a lower middle part of the lightly-doped N-type silicon substrate and a heavily-doped P-type collector region layer located at a lower part of the lightly-doped N-type silicon substrate;

a first trench and a second trench, which are located in the P-type doped well layer and separate from each other, extended into the lightly-doped N-type drift layer, the first trench and the second trench are internally provided with a first gate portion and a second gate portion, respectively, with the first gate portion being isolated from the first trench through a first gate silicon dioxide layer, and the second gate portion being isolated from the second trench through a second gate silicon dioxide layer;

a heavily-doped P-type source region and a heavily-doped N-type source region, which are sequentially connected, located between the first trench and the second trench, and are arranged at an upper part of the P-type doped well layer in a horizontal direction, with the heavily-doped P-type source region being located at a periphery of the second trench, and the heavily-doped N-type source region being located at a periphery of the first trench;

wherein a middle part and the upper part of the P-type doped well layer are provided with an N-type doped well layer and a P-type doped base region layer, respectively, and the heavily-doped P-type source region and the heavily-doped N-type source region are both located at an upper part of the P-type doped base region layer; and wherein a surface, distant from the lightly-doped N-type buffer layer, of the heavily-doped P-type collector region layer is covered with a collector layer, wherein an upper surface of the heavily-doped P-type source region and an upper surface of the heavily-doped N-type source region are covered with an emitter layer, wherein a first gate layer and a second gate layer are located on an upper surface of the first gate portion and an upper surface of the second gate portion, respectively.

2. The double-gate trench-type insulated-gate bipolar transistor device as claimed in claim 1, wherein a width of the heavily-doped P-type source region is greater than a width of the heavily-doped N-type source region.

3. The double-gate trench-type insulated-gate bipolar transistor device as claimed in claim 2, wherein the first trench and the second trench are extended to an upper part of the lightly-doped N-type drift layer.

4. The double-gate trench-type insulated-gate bipolar transistor device as claimed in claim 2, wherein the first gate portion and the second gate portion are both polycrystalline silicon gate portions.

5. The double-gate trench-type insulated-gate bipolar transistor device as claimed in claim 2, wherein the first gate silicon dioxide layer and the second gate silicon dioxide layer are both silicon dioxide layers.

6. The double-gate trench-type insulated-gate bipolar transistor device as claimed in claim 2, wherein a width ratio of the heavily-doped N-type source region to the heavily-doped P-type source region is 1:1.5 to 1:3.

7. The double-gate trench-type insulated-gate bipolar transistor device as claimed in claim 2, wherein a depth, in the P-type doped base region layer, of the heavily-doped P-type source region is the same as that of the heavily-doped N-type source region.

8. The double-gate trench-type insulated-gate bipolar transistor device as claimed in claim 2, wherein a depth ratio of the P-type doped base region layer to the heavily-doped P-type source region and a depth ratio of the P-type doped base region layer to the heavily-doped N-type source region are 10:4 to 10:6.

9. The double-gate trench-type insulated-gate bipolar transistor device as claimed in claim 2, wherein an area of a part of the emitter layer covering the heavily-doped P-type source region is greater than an area of a part of the emitter layer covering the heavily-doped N-type source region.

10. The double-gate trench-type insulated-gate bipolar transistor device as claimed in claim 1, wherein the first trench and the second trench are extended to an upper part of the lightly-doped N-type drift layer.

11. The double-gate trench-type insulated-gate bipolar transistor device as claimed in claim 1, wherein the first gate portion and the second gate portion are both polycrystalline silicon gate portions.

12. The double-gate trench-type insulated-gate bipolar transistor device as claimed in claim 1, wherein the first gate silicon dioxide layer and the second gate silicon dioxide layer are both silicon dioxide layers.

13. The double-gate trench-type insulated-gate bipolar transistor device as claimed in claim 1, wherein a width ratio of the heavily-doped N-type source region to the heavily-doped P-type source region is 1:1.5 to 1:3.

14. The double-gate trench-type insulated-gate bipolar transistor device as claimed in claim 1, wherein a depth, in the P-type doped base region layer, of the heavily-doped P-type source region is the same as that of the heavily-doped N-type source region.

15. The double-gate trench-type insulated-gate bipolar transistor device as claimed in claim 1, wherein a depth ratio of the P-type doped base region layer to the heavily-doped P-type source region and a depth ratio of the P-type doped base region layer to the heavily-doped N-type source region are 10:4 to 10:6.

16. The double-gate trench-type insulated-gate bipolar transistor device as claimed in claim 1, wherein an area of a part of the emitter layer covering the heavily-doped P-type source region is greater than an area of a part of the emitter layer covering the heavily-doped N-type source region.

* * * * *